United States Patent [19]

Ruesch et al.

[11] Patent Number: 5,532,953
[45] Date of Patent: Jul. 2, 1996

[54] FERROELECTRIC MEMORY SENSING METHOD USING DISTINCT READ AND WRITE VOLTAGES

[75] Inventors: Rodney A. Ruesch; Manooch Golabi, both of Colorado Springs, Colo.

[73] Assignee: Ramtron International Corporation, Colorado Springs, Colo.

[21] Appl. No.: 413,083

[22] Filed: Mar. 29, 1995

[51] Int. Cl.[6] .................................................. G11C 11/22
[52] U.S. Cl. ............................................ 365/145; 365/149
[58] Field of Search ..................................... 365/145, 149

[56] References Cited

U.S. PATENT DOCUMENTS

| | | | |
|---|---|---|---|
| 5,270,967 | 12/1993 | Moazzami et al. | 365/145 |
| 5,309,391 | 5/1994 | Papaliolios | 365/145 |

*Primary Examiner*—David C. Nelms
*Assistant Examiner*—Son Dinh
*Attorney, Agent, or Firm*—Peter J. Meza

[57] ABSTRACT

A method of operating a nonvolatile ferroelectric memory cell including a polarized ferroelectric capacitor includes the steps of reading and restoring a first polarization state of the ferroelectric capacitor at a voltage not sufficient to fully saturate the ferroelectric capacitor, but sufficient to release a detectable amount of charge corresponding to the first polarization state. Writing a second polarization state in the ferroelectric capacitor is performed at a voltage sufficient to fully saturate the ferroelectric capacitor. During a read and restore operation, the plate line of the memory cell is pulsed with first and second voltage pulses that each have a voltage magnitude less than the normal five volt logic pulse, for example four volts. During a write operation, the plate line of the memory cell is pulsed with a voltage that has a magnitude greater than the normal five volt logic pulse, for example six to seven volts.

20 Claims, 8 Drawing Sheets

FERROELECTRIC MEMORY SENSING METHOD USING DISTINCT READ AND WRITE VOLTAGES

BACKGROUND OF THE INVENTION

This invention relates generally to ferroelectric memory cells. More particularly, the present invention relates to a method of operating a ferroelectric memory cell and related apparatus for improving retention performance, i.e. the ability of the memory cell to retain data when exercised over time.

Figure 1:
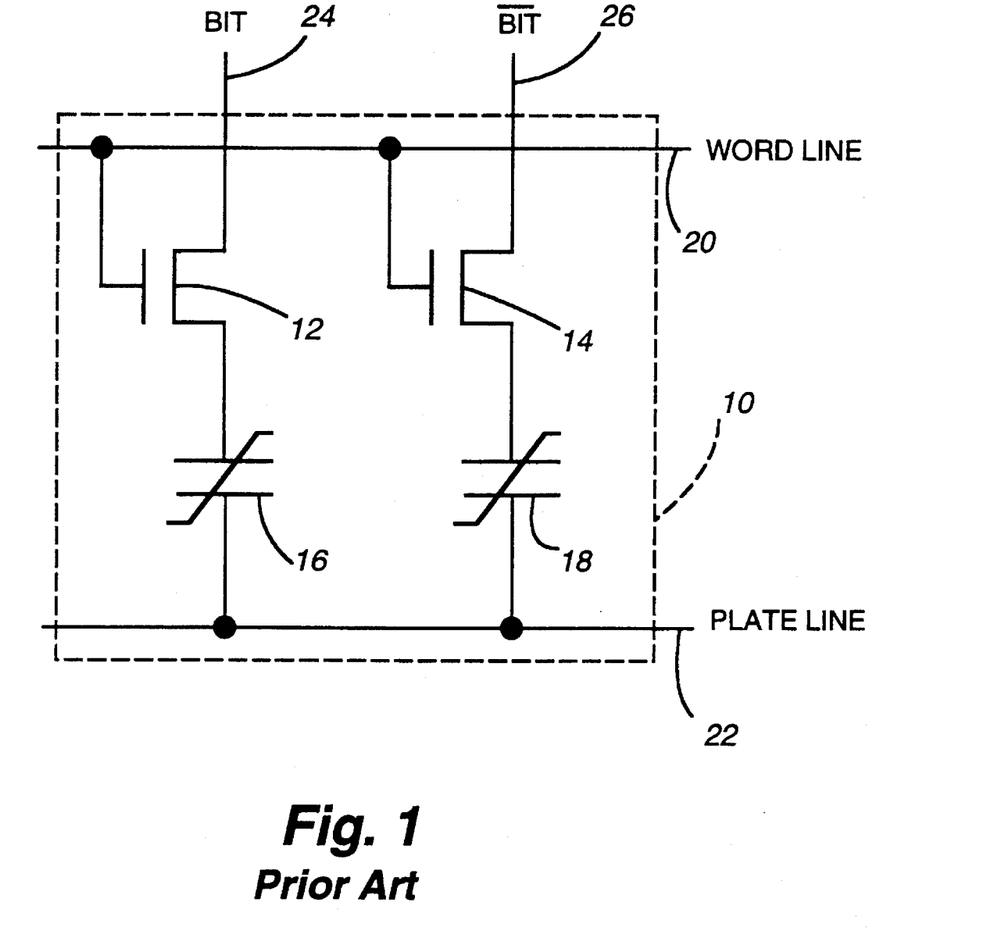
FIG. 1 is a schematic diagram of a prior art 2T-2C ferroelectric memory cell including distinct word, plate, and bit lines.

In FIG. 1, a two-transistor two capacitor ("2T-2C") ferroelectric memory cell 10 is shown. Ferroelectric memory cell 10 includes two MOS transistors 12 and 14 respectively coupled to two ferroelectric capacitors 16 and 18. The data state of memory cell 10 is determined by the opposite polarization states of ferroelectric capacitors 16 and 18, as is explained in further detail below. A "one" data state may be represented by an "up" polarization state in ferroelectric capacitor 16 and a "down" polarization state in ferroelectric capacitor 18, whereas a "zero" data state may be represented by a "down" polarization state in ferroelectric capacitor 16 and an "up" polarization state in ferroelectric capacitor 18. The correlation between memory cell data states and the polarization of the ferroelectric capacitors in the memory cell is arbitrary and may be changed. Capacitors 16 and 18 must have opposite polarization directions for a valid data state, however.

The gate electrodes of access transistors 12 and 14 are coupled to a word line 20, which is also coupled to other ferroelectric memory cells (not shown in FIG. 1) in a row of an array of such cells. Word line 20 selectively energizes access transistors 12 and 14 to couple ferroelectric capacitors 16 and 18 to a differential bit line consisting of a bit line 24 and an inverted bit line 26. Bit line 24 and inverted bit line 26 are also coupled to other ferroelectric memory cells (not shown in FIG. 1) in a column of an array of such cells. Bit line 24 and bit line 26 receive the charge developed by poling (voltage pulsing) ferroelectric capacitors 16 and 18, which is later developed into a full logic voltage differential signal, usually five volts and ground. Ferroelectric capacitors 16 and 18 are also coupled to an active plate line 22, which is also coupled to other ferroelectric memory cells (also not shown in FIG. 1) in a row of an array of such cells.

The operation of a ferroelectric capacitor such as ferroelectric capacitor 16 or 18 in memory cell 10 is illustrated in FIGS. 2A–D by way of a series of hysteresis loop diagrams 28A–D and corresponding voltage waveform diagrams 38A–D. Hysteresis loop diagrams 28A–D show the electrical performance of a ferroelectric capacitor, wherein the x-axis represents the voltage applied across the capacitor, and the y-axis represents the charged evolved by the ferroelectric capacitor in response to the applied voltage. Corresponding waveform diagrams 38A–D are a series of two positive voltage pulses and two negative voltage pulses that are applied across a ferroelectric capacitor in a known sequence that illustrates the complete electrical behavior of a ferroelectric capacitor.

Figure 2A:
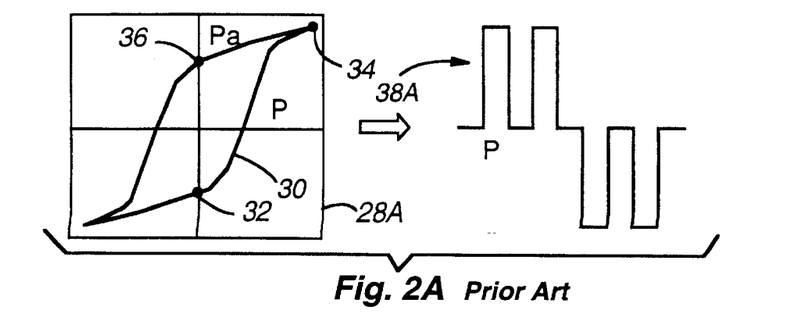
FIGS. 2A–2D are a series of four hysteresis loop diagrams and four corresponding waveform timing diagrams that serve to illustrate the electrical performance of a ferroelectric capacitor.

Hysteresis loop diagram 28A of FIG. 2A includes a hysteresis loop 30 and an initial operating point 32. Operating point 32 represents a ferroelectric capacitor having, by convention, an "up" polarization state, but with no applied voltage across the capacitor. The initial operating point 32 is achieved by a previous application and removal of a negative applied voltage across the capacitor. The operating point of the ferroelectric capacitor moves from operating point 32 to operating point 34 upon the application of a positive voltage pulse. Operating point 34 represents a fully saturated ferroelectric capacitor operating condition, i.e. further increases in applied voltage do not yield an appreciable amount of extra charge. The amount of charge evolved from operating point 32 to operating point 34 (the difference in the y-axis values) is designated "P". The "P" charge is termed a "switched charge" because the application of the external voltage pulse switches the polarization state of the ferroelectric capacitor. The leading edge of the first positive pulse in waveform diagram 38A is also labeled "P". Once the positive "P" pulse is removed, the operating point moves along hysteresis loop 30 from operating point to 34 to operating point 36. The amount of charge evolved from operating point 34 to operating point 36 is designated "Pa" (for "P"-after). The "Pa" charge is termed a "linear charge" because the removal of the external voltage pulse does not switch the polarization state of the ferroelectric capacitor, and the charge evolved by the capacitor is approximately linearly related to the applied voltage.

Figure 2B:
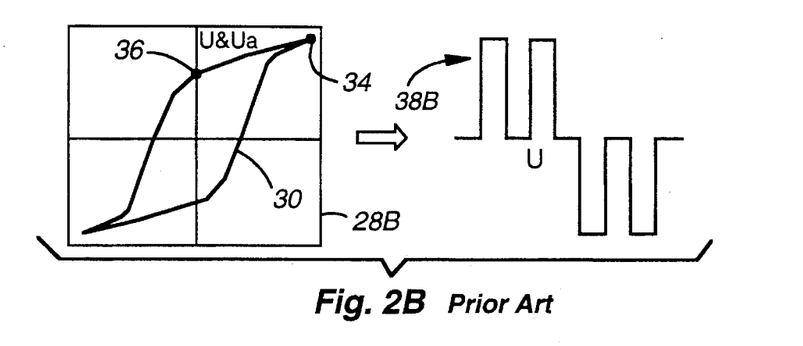

Hysteresis loop diagram 28B of FIG. 2B includes a hysteresis loop 30 and an initial operating point 36. Operating point 36 represents a ferroelectric capacitor having, by convention, a "down" polarization state, but with no applied voltage across the capacitor. The operating point of the ferroelectric capacitor moves from operating point 36 to operating point 34 upon the application of a second positive voltage pulse. The amount of charge evolved from operating point 36 to operating point 34 is designated "U", and it is a linear charge. The leading edge of the second positive pulse in waveform diagram 38B is also labeled "U". Once the positive "U" pulse is removed, the operating point moves along hysteresis loop 30 from operating point to 34 back to operating point 36. The amount of charge evolved from operating point 34 to operating point 36 is designated "Ua" (for "U"-after) and is approximately equal to the "U" and "Pa" charge components.

Figure 2C:
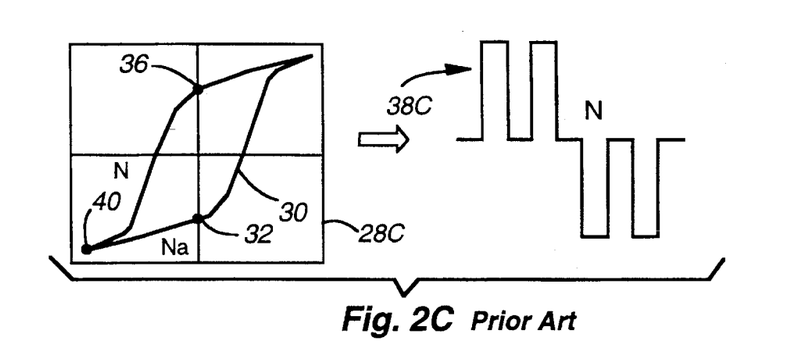

Hysteresis loop diagram 28C of FIG. 2C includes a hysteresis loop 30 and an initial operating point 36. The operating point of the ferroelectric capacitor moves from operating point 36 to operating point 40 upon the application of a first negative voltage pulse. The amount of charge evolved from operating point 36 to operating point 40 is designated "N", and it is a switched charge. The leading edge of the first negative pulse in waveform diagram 38C is also labeled "N". Once the negative "N" pulse is removed, the operating point moves along hysteresis loop 30 from operating point to 40 back to the initial operating point 32. The amount of charge evolved from operating point 40 to the initial operating point 32 is designated "Na" (for "N"-after).

Figure 2D:
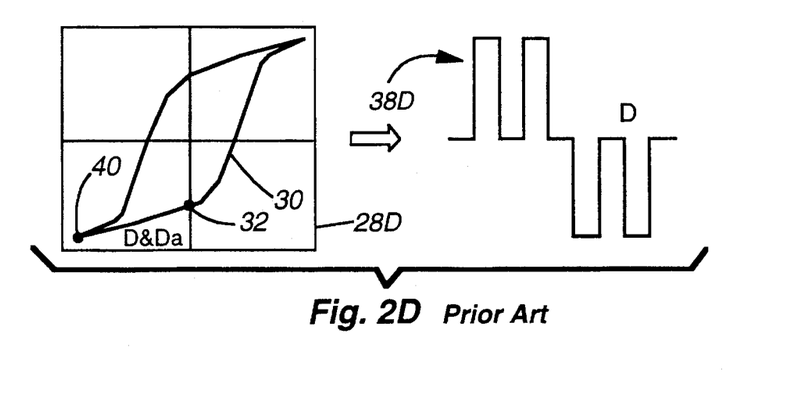

Hysteresis loop diagram 28D of FIG. 2D includes a hysteresis loop 30 and an initial operating point 32. The operating point of the ferroelectric capacitor moves from operating point 32 to operating point 40 upon the application of a second negative voltage pulse. The amount of charge evolved from operating point 32 to operating point 40 is designated "D", and it is a linear charge. The leading edge of the second negative pulse in waveform diagram 38D is also labeled "D". Once the negative "D" pulse is removed, the operating point moves along hysteresis loop 30 from operating point to 40 back to operating point 32. The amount of charge evolved from operating point 40 to operating point 32 is designated "Da" (for "D"-after) and is approximately equal to the "D" and "Na" charge components.

Figure 2E:
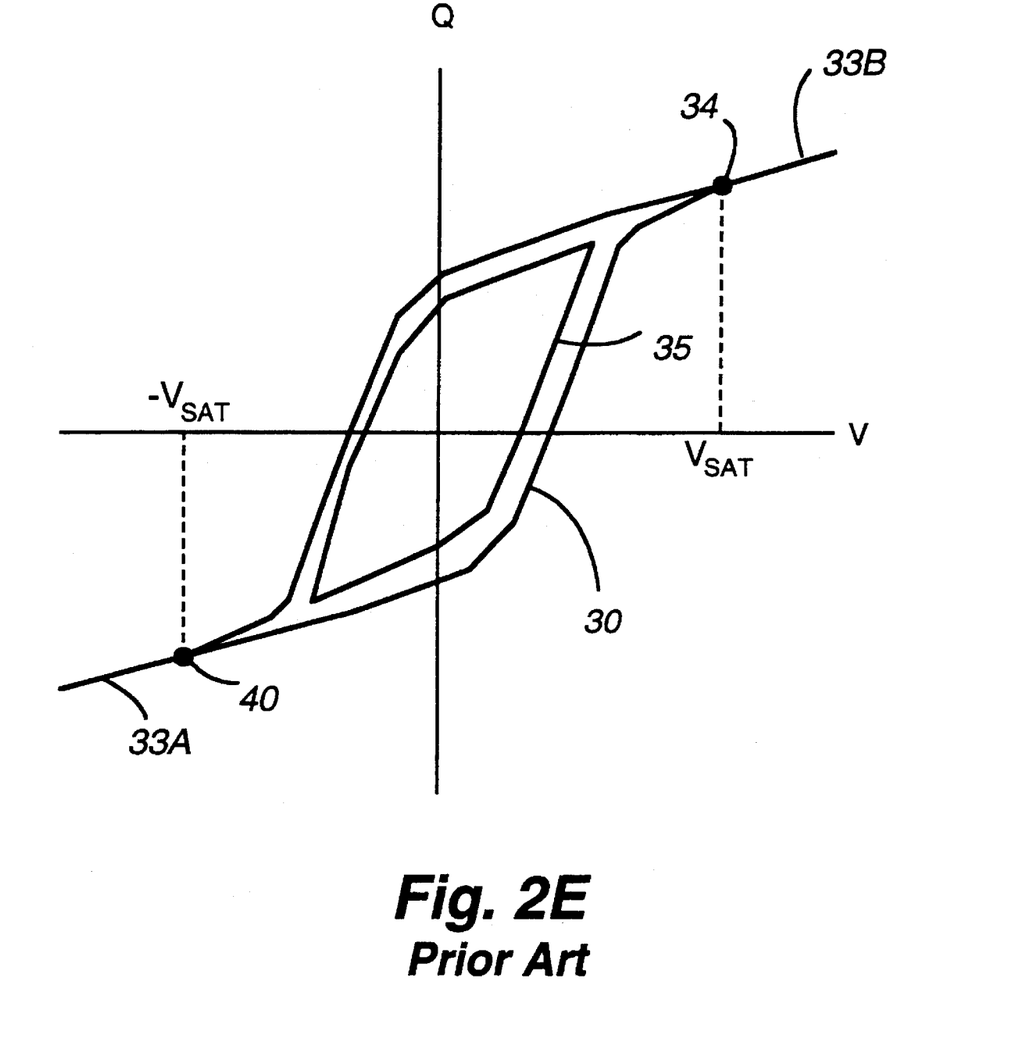
FIG. 2E is a diagram of a hysteresis loop and a sub-loop for defining the saturation voltage of a ferroelectric material.

Referring again to FIG. 2E, a ferroelectric material or capacitor is said to be "fully saturated" at operating points 34 and 40 of the hysteresis loop 30. The corresponding externally applied voltage at the saturation points is defined as "Vsat", for saturation voltage. Applying an external voltage beyond the saturation voltage results in extensions of the hysteresis loop 33A and 33B in which fewer and fewer ferroelectric "domains" switch in response to the applied voltage. A "partially saturated" ferroelectric material or capacitor is shown as a "sub-loop" 35 generated in response to an externally applied voltage less than saturation voltage. Another way of discerning the distinction between full saturation and partial saturation is that a partially saturated ferroelectric material will fall on a sub-loop, while a fully saturated ferroelectric material will fall on a fully expanded hysteresis loop, such as hysteresis loop 30 shown in FIG. 2E. A typical ferroelectric dielectric material used for ferroelectric capacitors is lead zirconate titanate ("PZT"). If the PZT material is used, the saturation voltage, Vsat, is about five volts. For full saturation, an externally applied voltage pulse of about six to seven volts is used. This will ensure that virtually all of the ferroelectric domains in the material have switched, with operating points along sections 33A and 33B of hysteresis loop 30. For partial saturation, which is operation on a sub-loop with voltages less than the saturation voltage, a voltage pulse of about four volts is used. A four volt pulse ensures that, while the ferroelectric material is not completely saturated, a sufficient quantity of charge is evolved that can be detected by conventional memory sense circuitry.

Figure 3:
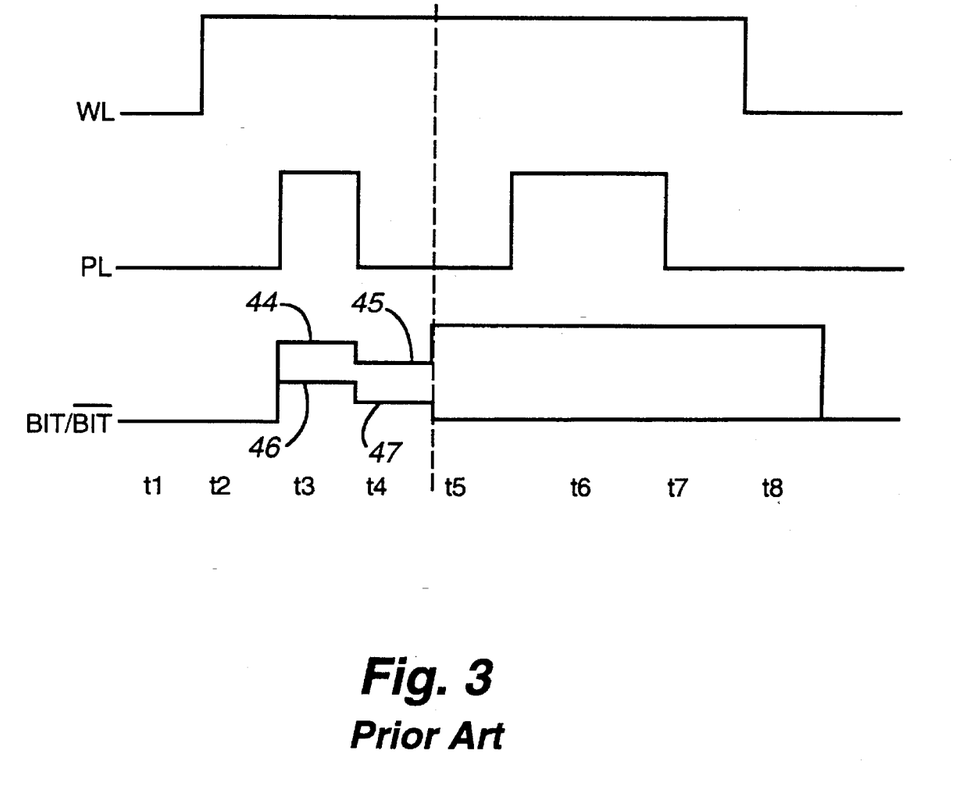
FIG. 3 is a timing diagram illustrating the prior art "up-down" method of reading, sensing, and restoring a ferroelectric memory cell.

Referring now to FIG. 3, a waveform diagram shows the word line (WL), plate line (PL) and combined bit/inverted bit line (BIT and BIT) waveforms associated with the reading and restore operation of the 2T-2C ferroelectric memory cell 10 of FIG. 1. At time t1, all three signals are at a logic zero or ground potential. At time t2, the WL signal is energized to a logic one potential, usually five volts. With the WL signal at logic one, the gate electrodes of access transistors 12 and 14 are energized, but there is no current flow through the transistors because the PL, Bit, and/Bit signals are at a logic zero. At time t3 the PL signal is energized and charge is released onto the bit and inverted bit lines 24 and 26. The charge components are shown in the bit line waveform as levels 44 and 46, which correspond to charge components P and U. At time t4 the PL pulse is removed, and the bit line charge is modified. The P charge component 44 is modified by the subtraction of the Pa charge component, leaving a charge equal to (P–Pa) shown in the bit line waveform as level 45. The U charge component 46 is also modified by the subtraction of the Ua charge component, leaving a very small charge shown in the bit line waveform as level 47. Once the charge levels 45 and 47 have been established, they are sensed in the conventional manner and converted into full logic levels (dashed line between times t4 and t5). At time t5 the full logic levels have been established. In FIG. 3, the bit line is shown to be a logic one level, usually five volts, and the inverted bit line is shown to be at a logic zero level, usually at ground potential. At time t6, the PL signal is again pulsed to a logic one to restore the original data state in ferroelectric memory cell 10. At time t7, the PL signal is returned to a logic zero state, and at time t8, the WL signal is returned to a logic zero state. Ferroelectric memory cell 10 is now returned to the same quiescent state that existed at time t1, and is ready for another read and restore cycle. The reading/sensing/restoring operation demonstrated with respect to FIG. 3 is known in the prior art as the "up-down" sensing method, since the plate line must be transitioned up and back down before the bit line charge is sensed and converted into full logic levels.

The same word line and plate line signals shown in FIG. 3 can be used for a writing operation. The only difference is that prior to the sensing operation, bit lines 24 and 26 are written to, i.e. forced to receive a data state that may be the same or opposite to levels 45 and 47 shown in FIG. 3. The new bit line charge levels are again conventionally resolved into full logic levels, and with the exact WL and PL waveforms shown in FIG. 3.

Whether memory cell 10 is being read and restored, or written to, it is important to note that in the prior art that the first and second plate line pulses are the same voltage magnitude, about five volts. The first pulse is used to read the data state of memory cell 10 and has a pulsed voltage of about five volts. The second plate line pulse is used either restore the originally read data state, or to write a new data state to memory cell 10. In either case, in the prior art, the second pulse also has a pulsed voltage of about five volts.

The reading, restoring, and writing operations described above with respect to FIGS. 1–3 adequately exercise ferroelectric memory cell 10 such that it operates as a nonvolatile memory cell. However, when operated for a long period of time, memory cell 10 eventually loses its ability to retain data. Various mechanisms such as compensation from mobile ions within the ferroelectric dielectric material in ferroelectric capacitors 16 and 18 are thought to be at least partially responsible for the lack of data retention.

What is desired is another method of operating memory cell 10 so that data retention performance can be extended beyond that which is possible with the current prior art technique described above.

SUMMARY OF THE INVENTION

It is, therefore, a principal object of the present invention to improve the data retention performance of a ferroelectric memory.

It is another object of the invention to extend the useful life of a ferroelectric memory.

It is another object of the invention to improve the yield of a ferroelectric memory.

It is an advantage of the invention that the improved method can be practiced without significantly increasing the die size of the ferroelectric memory integrated circuit.

According to the present invention a method of operating a nonvolatile ferroelectric memory cell including a polarized ferroelectric capacitor includes the steps of reading and restoring a first polarization state of the ferroelectric capacitor at a voltage not sufficient to fully saturate the ferroelectric capacitor, but sufficient to release a detectable amount of charge corresponding to the first polarization state. Writing a second polarization state in the ferroelectric capacitor is performed at a voltage sufficient to fully saturate the ferroelectric capacitor.

The method can be practiced on either a one transistor-one capacitor ("1T-1C") or a two transistor-two capacitor ("2T-2C") ferroelectric memory cell. During a read and restore operation, the plate line of the memory cell is pulsed with first and second voltage pulses that each have a voltage magnitude less than the normal five volt logic pulse, for example four volts, if PZT ferroelectric material is used. During a write operation, the plate line of the memory cell is pulsed with a voltage that has a magnitude greater than the normal five volt logic pulse, for example six to seven volts if PZT ferroelectric material is used. The combination of low voltage and high voltage plate line pulses preserves the retention ability of the ferroelectric memory cell.

The normal ferroelectric memory architecture is modified to include a charge pump/voltage regulator circuit in combination with the plate line and word line driver circuits, as well as other timing circuits, for selectively applying the required ground, low, and high voltages to the word and plate lines.

The foregoing and other objects, features and advantages of the invention will become more readily apparent from the following detailed description of a preferred embodiment of the invention which proceeds with reference to the accompanying drawings.

DETAILED DESCRIPTION

Figure 4A:
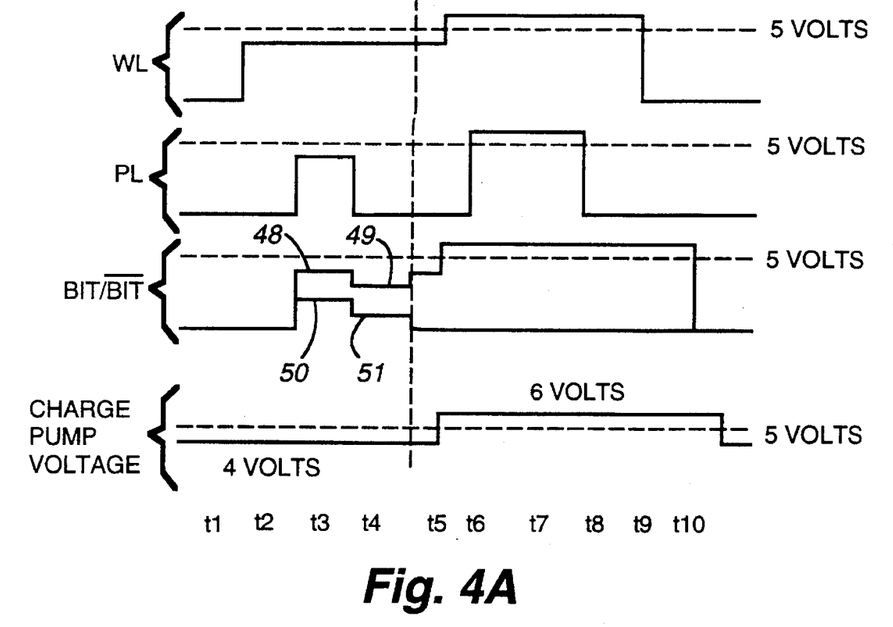
FIG. 4A is a timing diagram illustrating a method of reading and writing a ferroelectric memory cell according to the present invention.
Figure 4B:
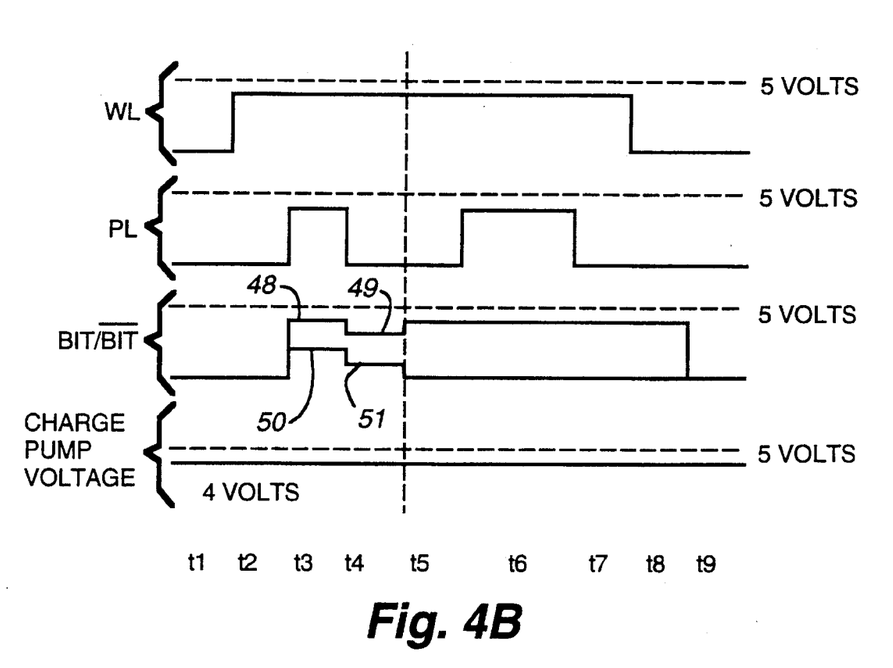
FIG. 4B is a timing diagram illustrating a method of reading and restoring a ferroelectric memory cell according to the present invention.

Referring now to FIGS. 4A and 4B, two sets of waveform diagram each include word line (WL), plate line (PL), combined bit/inverted bit line (BIT and /BIT) waveforms, as well as a "Charge Pump Voltage" waveform associated with the reading and writing operation (FIG. 4A), and the reading and restoring operation (FIG. 4B) of the 2T-2C ferroelectric memory cell 10 of FIG. 1. The Charge Pump Voltage indirectly controls the voltage levels of the plate line pulses and the word line pulse as is described in further detail below with respect to FIGS. 5, 6A and 6B.

Referring now specifically to FIG. 4A, at time t1, the WL, PL, and bit line signals are at a logic zero or ground potential. In addition, the Charge Pump Voltage is at about four volts, or one volt lower than the nominal supply voltage of five volts. At time t2, the WL signal is energized to a logic one potential, but at the Charge Pump Voltage level of four volts. The four volt WL signal is still sufficient to energize the gate electrodes of access transistors 12 and 14, again with no current flow at time t2. At time t3 the PL signal is energized with a four volt pulse and charge is again released onto the bit and inverted bit lines 24 and 26. The charge components are shown in the bit line waveform as levels 48 and 50, which correspond to slightly diminished charge components P and U. These charge components are slightly diminished because the four volt plate line pulse is not sufficient to fully saturate the hysteresis loop 30 of the ferroelectric capacitors 16 and 18. At time t4 the PL pulse is removed, and the bit line charges are modified as in the prior art scheme, but from the diminished levels corresponding to the four volt plate line pulse. Once the modified charge levels 49 and 51 have been established, they are of a sufficient magnitude that they call still be sensed in the conventional manner and converted into full logic levels (dashed line between times t4 and t5). At time t5 the full logic levels have been established of ground and four volts. At time t6 the Charge Pump Voltage waveform is stepped up to a six volt level, which in turn boosts the logic level voltages on the bit lines to six volts and ground, and also boosts the WL signal to six volts. At time t7, the PL signal is again pulsed to a logic one, but this time to a six volt level, to write the desired data state in ferroelectric memory cell 10 by fully saturating memory cell capacitors 16 and 18. At time t8, the PL signal is returned to a logic zero state, and at time t9, the WL signal is returned to a logic zero state. At time t10, the Charge Pump Voltage is returned to the original four volt value. Ferroelectric memory cell 10 is now returned to the same quiescent state that existed at time t1, and is ready for another read and write cycle.

The improved reading and writing operation described with respect to FIG. 4A has been empirically shown to improve the retention characteristics of memory cell 10. The retention improvement is explained in further detail with respect to FIGS. 7 and 8 below.

A reading and restoring operation is shown in FIG. 4B, in which the ferroelectric capacitors 16 and 18 are not fully saturated. The operation proceeds identically as the reading and writing operation of FIG. 4A until time t4. Also, no data is forced onto the bit lines, the only charge being present are charge components 49 and 51 resulting from the read operation at times t1–t4. At time t5 the full logic levels have again been established of ground and four volts. The Charge Pump Voltage waveform during this operation, however remains at the four volt level. At time t6, the PL signal is again pulsed to a logic one, but at the four volt level, to restore the existing data state in ferroelectric memory cell 10 by partially saturating memory cell capacitors 16 and 18. At time t7, the PL signal is returned to a logic zero state, and at time t8, the WL signal is returned to a logic zero state. At time t9, the bit lines are reset and ferroelectric memory cell 10 is now returned to the same quiescent state that existed at time t1, and is ready for another read and restore cycle.

In FIGS. 4A and 4B, the total cycle time depicted is about 250 nanoseconds, with the write pulse in FIG. 4A and the restore pulse in FIG. 4B having a pulse width of about 20 nanoseconds. The pulsewidth of the initial read pulse is about the same as the write and restore pulse.

Figure 5:
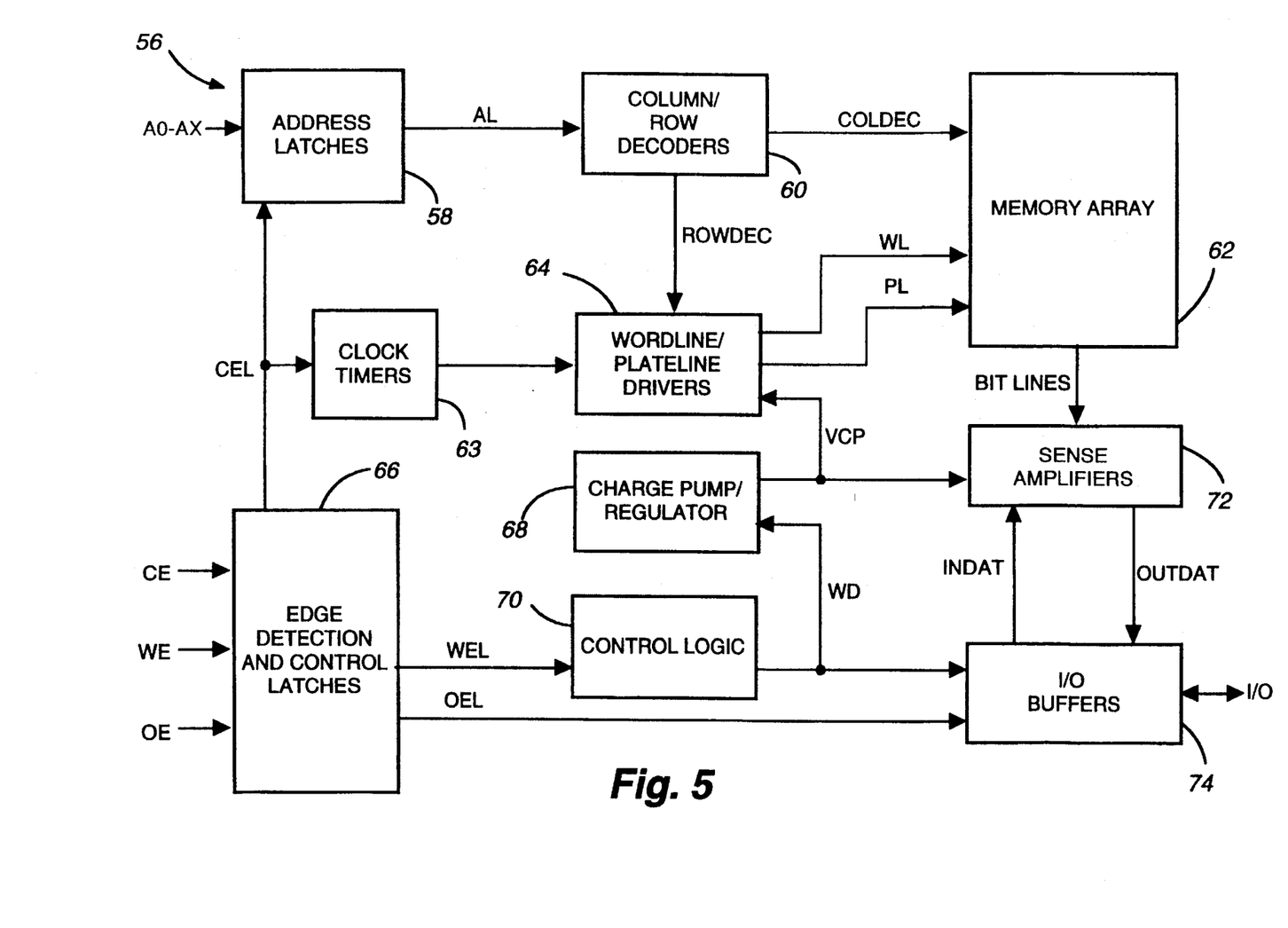
FIG. 5 is a block diagram of a ferroelectric memory architecture modified to effect the method of the present invention.

The architecture 56 for a ferroelectric memory integrated circuit that is capable of carrying out the method of the present invention is shown in FIG. 5. Most of the functional blocks shown in the block diagram of FIG. 5 are conventional to DRAM and ferroelectric memory design, with the exception of charge pump/regulator block 68, which is described in further detail below.

An edge detection/control latch block 66 is used to detect and determine valid transitions on the Chip Enable (CE), Write Enable (WE), and the Output Enable (OE) inputs. The signals are valid when they transition from a logic one to a logic zero level and are held at logic zero for about 15 ns. The control latches capture the valid signals and hold them until a functional cycle is completed. A block 58 of address latches captures and holds the address when the chip enable signal is detected as valid. Address latch block 58 receives the addresses on address bus designated A0-AX. A latched output address (AL) is held at the output of latch block 58. A column/row decoder 60 receives the latched address AL and selects the proper column in the memory array from the address that are captured at the start of the functional cycle. The column decode signal (COLDEC) is presented to an array 62 of ferroelectric memory cells arranged in rows and columns. The row decoder portion selects the proper word line and plate line that access memory array 62 from the address captured at the start of the cycle. The row decoder portion generates a row decode signal (ROWDEC). A block of clock timers 63 is controlled by the initiation of a chip enable latched signal (CEL) at the start of a valid read/restore or read/write cycle. The clock timer block 63 generates the proper pulse sequence to a block 64 of wordline and plateline drivers. Wordline and plateline driver block 64 is further controlled by the ROWDEC signal to provide the appropriate word line (WL) and plate line (PL) signals to the selected row of ferroelectric memory cells.

A charge pump/regulator 68 supplies a dual value supply voltage, VCP, to word line drivers, plate line drivers in block 64 and to the bit lines in the memory array 62 via sense amplifier block 72. The external Vcc power supply received by the ferroelectric memory integrated circuit is nominally five volts. The Vcc power supply voltage is stepped down to about four volts at the start and end of any functional cycle and applied to the proper circuits by the internal charge pump voltage (Vcp). If the function is a read, the write detect signal (WD) remains low and the Vcp level remains at four volts. If the function is a write, a control logic block 70 sets the WD signal to a logic one and activates the charge pump/regulator 68. Charge pump/regulator 68 step up the Vcp signal to about 6.5 V and holds that level until the write pulse sequence is completed. The WD signal is released by control logic block 70 and the Vcp signal is stepped back to about four volts.

I/O buffers 74 receive and drives the data to and from the memory. I/O buffers 74 are controlled by the state of the control latches 66 by signal OEL. During a read operation, I/O buffers 74 are placed in a mode to receive data (OUT-DAT) from the array 62 through sense amplifiers 72. During a write, I/O buffers 74 are placed in a mode to receive data from the I/O pads and pass this data (INDAT) to array 62 through sense amplifiers 72. Sense amplifiers 72 receives complementary data from the bit lines of memory array 62. One sense amplifier compares the two levels on each differential bit line and determines the state of individual ferroelectric memory cells. The state of each individual memory cell is restored after it is read. During a read operation, data is transferred from sense amplifiers 72 to the I/O buffer 74 by the Outdat signal. In the write mode, the data from the I/O buffers overdrives the sense amplifiers 72 with the Indat signals. Sense amplifiers 72 forces the data onto the bit lines to be stored into the cells using the write timing sequence.

Figure 6A:
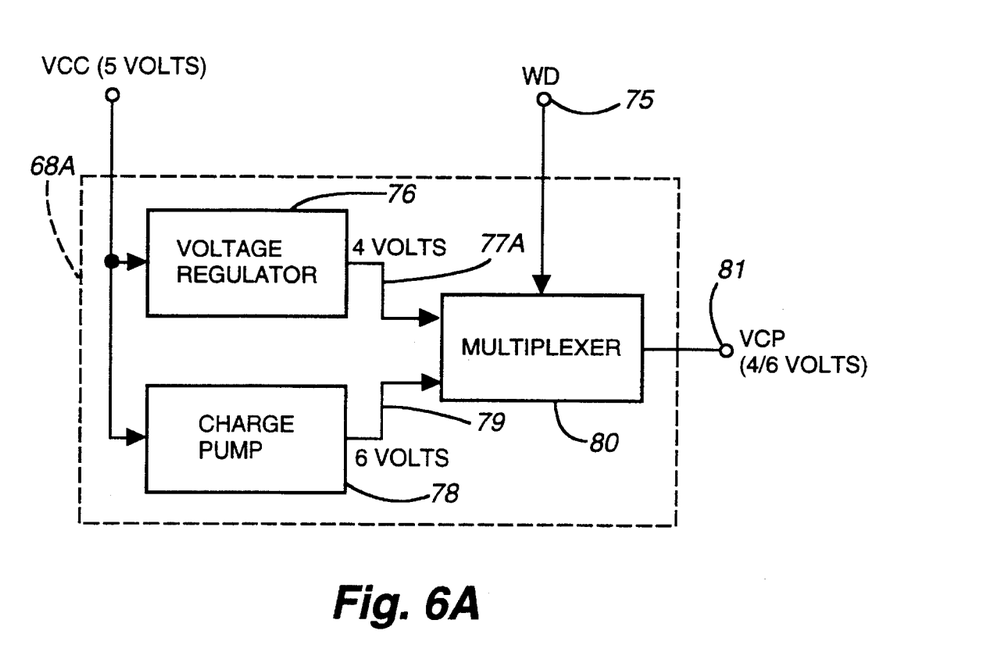
FIGS. 6A and 6B are schematic/block diagrams of two embodiments of a charge pump block shown in FIG. 5 capable of generating low and high voltages as required in the method of the present invention.

The charge pump/regulator 68 is a means for supplying the selectable power supply voltage Vcp to the word and plate line drivers 64. The charge pump/regulator block 68 is shown in further detail in FIGS. 6A and 6B. In FIG. 6A, charge pump/regulator 68A is the combination of a charge pump 78 and a voltage regulator 76. Voltage regulator 76 has an input for receiving the Vcc five volt power supply voltage and an output for generating a regulated four volt output voltage on conductor 77A. Charge pump 78 has an input also coupled to the Vcc five volt supply, and an output for generating a boosted voltage between six and seven volts on conductor 79. A multiplexer 80 has first and second inputs coupled to the outputs of voltage regulator 76 and charge pump 78, a third control input receiving the WD control signal at node 75, and an output for supplying the selectable Vcp power supply voltage at node 81.

Figure 6B:
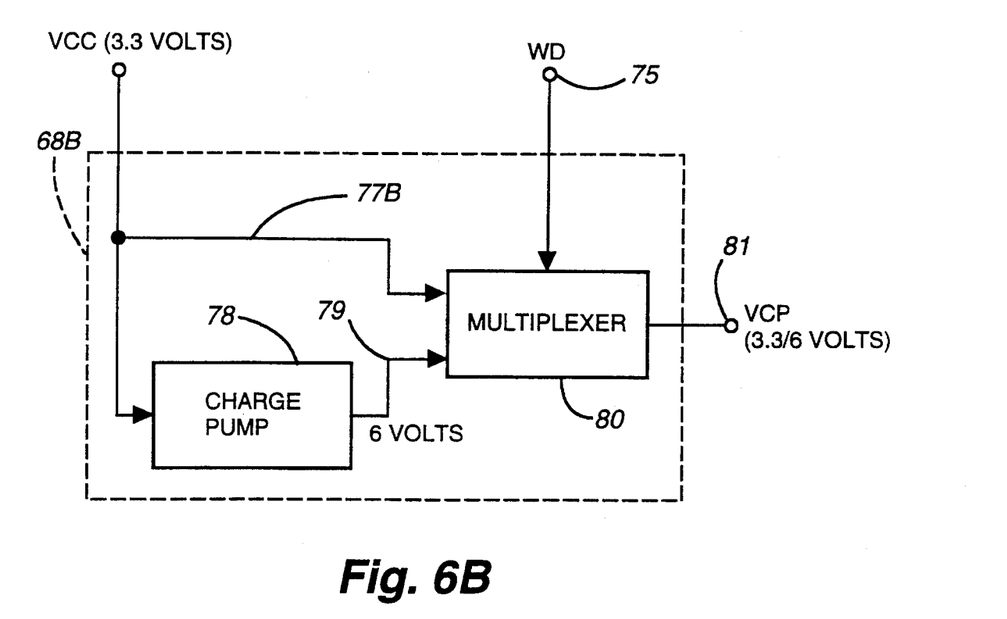

An alternative means 68B for supplying the Vcp power supply voltage is shown in FIG. 6B. In certain cases, a voltage regulator 76 can be omitted if the Vcc power supply voltage is low enough to only partially saturate the ferroelectric capacitors in the ferroelectric memory array of the integrated circuit. For example, an integrated circuit may have a 3.3 volt power supply voltage. This 3.3 volt power supply voltage could be fed directly into multiplexer 80 on conductor 77B without the necessity of an intervening voltage regulator 76. The resulting dual level Vcp output voltage at node 81 would have voltage levels of 3.3 volts and six volts. For this combination of voltages to be useful, the ferroelectric material used would have to be partially saturated at 3.3 volts and generating enough charge to be conventionally sensed.

Figure 7:
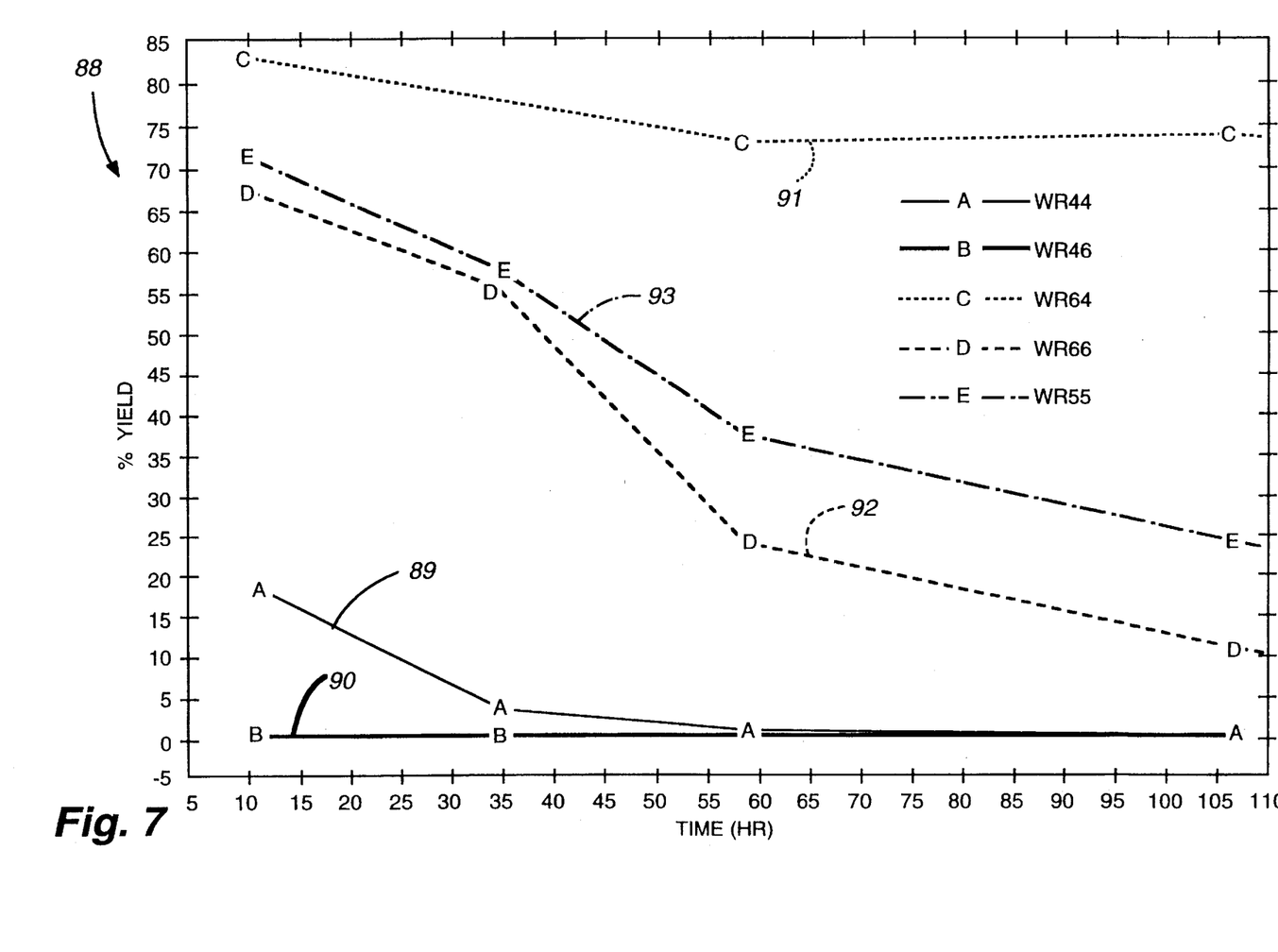
FIG. 7 is a graph of ferroelectric memory integrated circuit yield versus time for selected combinations of read and write voltages.

FIG. 7 is a graph 88 of ferroelectric memory integrated circuit yield versus time for selected combination of read and write voltages. The varying yields illustrated are primarily impacted by retention performance. Five different write/read voltage combinations were used, with the resulting data points (letters) and graph traces (dashed and solid lines) according to the following table:

| Trace No. | Data Letter | Write Voltage | Read Voltage |
|---|---|---|---|
| 89 | A | 4.0 volts | 4.0 volts |
| 90 | B | 4.0 volts | 6.0 volts |
| 91 | C | 6.0 volts | 4.0 volts |
| 92 | D | 6.0 volts | 6.0 volts |
| 93 | E | 5.0 volts | 5.0 volts |

The integrated circuit ferroelectric memory was held at an accelerated bake temperature of 150° C. for the period of time specified on graph 88, after initially being parametrically tested and programmed with a predetermined data pattern. The accelerated time of ten hours (first data point) at 150° C. is equivalent to about four years at 70° C. or twenty five years at 55° C. The memory was then tested at the first data point to determine whether or not the initial stored pattern was retained. With a four volt read pulse and six volt write pulse, the yield at the first data point is about 83%, the highest of all write/read voltages used. The yield (that is, number of good integrated circuit die divided by total die tested) was subsequently recorded at three other data points at 35 hours, about 60 hours, and about 107 hours. The four volt read/six volt write pulse combination demonstrated the best yield at all of the remaining data points.

Having described and illustrated the principles of the invention in a preferred embodiment thereof, it is appreciated by those having skill in the art that the invention can be modified in arrangement and detail without departing from such principles. For example, other ferroelectric materials can be used, such as lanthanum doped PZT ("PLZT"), bismuth titanate, as well as many others, in which case the corresponding low and high voltage values of Vcp would be modified according to the saturation voltage of the ferroelectric material. We therefore claim all modifications and variation coming within the spirit and scope of the following claims.

We claim:

1. A method of operating a nonvolatile ferroelectric memory cell including a polarized ferroelectric capacitor, the method comprising the steps of:

during a read operation, reading and restoring a first polarization state of the ferroelectric capacitor at a maximum voltage not sufficient to fully saturate the ferroelectric capacitor, but sufficient to release a detectable amount of charge corresponding to the first polarization state; and during a write operation, writing a second polarization state in the ferroelectric capacitor at a voltage sufficient to fully saturate the ferroelectric capacitor.

2. The method of claim 1 in which the reading and restoring step comprises the steps of:

applying a first voltage pulse across the ferroelectric capacitor;

sensing the charge across the ferroelectric capacitor; and applying a second voltage pulse across the ferroelectric capacitor, the first and second voltage pulses being of a magnitude insufficient to fully saturate the ferroelectric capacitor.

3. The method of claim 1 in which the writing step comprises the step of applying a voltage pulse across the ferroelectric capacitor sufficient to fully saturate the ferroelectric capacitor.

4. A method of operating a nonvolatile ferroelectric memory cell including a pair of polarized ferroelectric capacitors, a differential bit line, a word line, and a plate line, the method comprising the steps of:

in a read operation,
pulsing the plate line with a first voltage pulse not sufficient to fully saturate the ferroelectric capacitors, but sufficient to release a detectable amount of charge onto the differential bit line corresponding to a first data state,
resolving the charge on the differential bit line, and pulsing the plate line with a second voltage pulse not sufficient to fully saturate the ferroelectric capacitors but sufficient to restore the first data state; in a write operation,
pulsing the plate line with a first voltage pulse not sufficient to fully saturate the ferroelectric capacitors,
forcing a charge on the differential bit line corresponding to a desired second data state,
resolving the charge on the differential bit line, and
pulsing the plate line with a second voltage pulse sufficient to fully saturate the ferroelectric capacitors to establish the second data state.

5. The method of claim 4 in which the pulsing steps carried out at the voltage not sufficient to fully saturate the ferroelectric capacitors each comprise the step of pulsing the plate line with a voltage of about four volts.

6. The method of claim 4 in which the pulsing step carried out at the voltage sufficient to fully saturate the ferroelectric capacitors comprises the step of pulsing the plate line with a voltage of about six to seven volts.

7. The method of claim 4 further comprising the step of pulsing the word line with a voltage pulse having a first low voltage portion and a second higher voltage portion during the write operation.

8. The method of claim 7 in which the first low voltage portion occurs during the first plate line voltage pulse, and the second higher voltage portion occurs during the second plate line voltage pulse.

9. The method of claim 4 further comprising the step of pulsing the word line with a voltage pulse having a four volt portion and a six volt portion during the write operation.

10. The method of claim 4 in which:

the resolving step during the read operation comprises the step of converting the differential bit line charge into a first low voltage differential logic signal; and the resolving step during the write operation comprises the step of converting the differential bit line charge into a second higher voltage differential logic signal.

11. The method of claim 10 in which the resolving step during the read operation comprises the step of converting the differential bit line charge into a four volt differential logic signal.

12. The method of claim 10 in which the resolving step during the write operation comprises the step of converting the differential bit line charge into a six to seven volt differential logic signal.

13. A ferroelectric memory comprising:

a ferroelectric memory cell including a word line, a plate line, and a bit line; and means for selectively applying a ground voltage, a first low voltage and a second, high voltage to the word and plate lines.

14. A ferroelectric memory as in claim 13 in which the means for selectively applying a ground voltage, a first low voltage and a second, high voltage to the word and plate lines comprises:

means for selectively supplying either a low voltage pulse or a pulse having a first low voltage portion and a second high voltage portion to the word line; and means for selectively supplying either first and second low voltage pulses or a first low voltage pulse and a second high voltage pulse to the plate line.

15. A ferroelectric memory as in claim 13 in which the first low voltage is about four voltage and the second, high voltage is about six to seven volts.

16. A ferroelectric memory as in claim 13 in which the means for selectively applying a ground voltage, a first low voltage and a second, high voltage comprises:

a word line driver coupled to the word line;

a plate line driver coupled to the plate line; and means for supplying a selectable power supply voltage to the word and plate line drivers.

17. A ferroelectric memory as in claim 16 in which the means for supplying a selectable power supply voltage to the word and plate line drivers comprises the combination of a charge pump and a voltage regulator.

18. A ferroelectric memory as in claim 16 in which the means for supplying a selectable power supply voltage to the word and plate line drivers comprises:

a voltage regulator having an input for receiving a power supply voltage and an output;

a charge pump having an input for receiving a power supply voltage and an output; and a multiplexer having first and second inputs coupled to the outputs of the voltage regulator and charge pump, a third input receiving a control signal, and an output for supplying the selectable power supply voltage.

19. A ferroelectric memory as in claim 16 in which the means for supplying a selectable power supply voltage to the word and plate line drivers comprises:

a charge pump having an input for receiving a power supply voltage and an output; and a multiplexer having first and second inputs for receiving the power supply voltage and the output of the charge pump, a third input receiving a control signal, and an output for supplying the selectable power supply voltage.

20. A ferroelectric memory as in claim 13 in which the memory cell is part of an array of such cells arranged in rows and columns.

\* \* \* \* \*